(12) United States Patent
Van de Rijdt

(10) Patent No.: US 8,341,827 B2
(45) Date of Patent: Jan. 1, 2013

(54) DEVICE FOR PLACING A COMPONENT ON A SUBSTRATE

(75) Inventor: Johannes Hubertus Antonius Van de Rijdt, Gemert (NL)

(73) Assignee: Assembleon B.V. (NL)

(*) Notice: Subject to any disclaimer, the term of this patent is extended or adjusted under 35 U.S.C. 154(b) by 128 days.

(21) Appl. No.: 12/759,478

(22) Filed: Apr. 13, 2010

(65) Prior Publication Data

US 2010/0257731 A1  Oct. 14, 2010

(30) Foreign Application Priority Data

Apr. 14, 2009  (NL) ..................................... 1036851

(51) Int. Cl.
*B23P 19/00* (2006.01)
(52) U.S. Cl. ................. 29/743; 29/740; 29/741; 29/705; 29/834
(58) Field of Classification Search ................. 29/705, 29/720–721, 740–743; 356/375; 414/225.01, 414/744.8; 901/31
See application file for complete search history.

(56) References Cited

U.S. PATENT DOCUMENTS

| | | | |
|---|---|---|---|
| 5,839,186 A * | 11/1998 | Onodera | 29/720 |
| 5,894,657 A * | 4/1999 | Kanayama et al. | 29/740 |
| 6,178,626 B1 * | 1/2001 | Hada et al. | 29/833 |
| 6,374,484 B1 * | 4/2002 | Yoshida et al. | 29/740 |
| 6,606,788 B1 * | 8/2003 | Morimoto et al. | 29/832 |
| 6,748,648 B2 * | 6/2004 | Van De Rijdt | 29/740 |
| 6,792,676 B2 * | 9/2004 | Haji et al. | 29/832 |
| 7,146,718 B2 * | 12/2006 | Thuerlemann | 29/741 |
| 7,275,314 B2 * | 10/2007 | Yakiyama et al. | 29/832 |
| 7,353,589 B2 * | 4/2008 | Kawasumi et al. | 29/740 |
| 7,472,472 B2 * | 1/2009 | Takanami | 29/740 |
| 7,741,939 B2 * | 6/2010 | Van De Rijdt | 335/219 |

FOREIGN PATENT DOCUMENTS

| | | |
|---|---|---|
| EP | 0829192 | 3/1998 |
| EP | 1542523 | 6/2005 |

OTHER PUBLICATIONS

"Assembly Technique for Placing Electronic Components on Printed Circuit Wiring Patterns", IBM Technical Disclosure Bulletin, vol. 31, No. 10, Mar. 1989.
International Search Report dated Nov. 20, 2009, for NL 1036851.

* cited by examiner

*Primary Examiner* — Minh Trinh
(74) *Attorney, Agent, or Firm* — Barnes & Thornburg LLP

(57) ABSTRACT

A device suitable for placing a component on a substrate is provided with a component feeding device, a component pick-and-place device comprising a nozzle, a substrate carrier, means for moving the component pick-and-place device from the component feeding device to the substrate carrier and vice versa. A global measuring system is provided for determining the position of the component pick-and-place device during movement of the component pick-and-place device from the component feeding device to the substrate carrier and vice versa. The device is further provided with a local measuring system, remote from the global measuring system, for almost continually determining, in the proximity of a desired position of the component on the substrate, the position of the component pick-and-place device with respect to the substrate. The local measuring system is located closer to the substrate carrier than the global measuring system.

7 Claims, 3 Drawing Sheets

DEVICE FOR PLACING A COMPONENT ON A SUBSTRATE

BRIEF SUMMARY OF THE INVENTION

Figure 1:
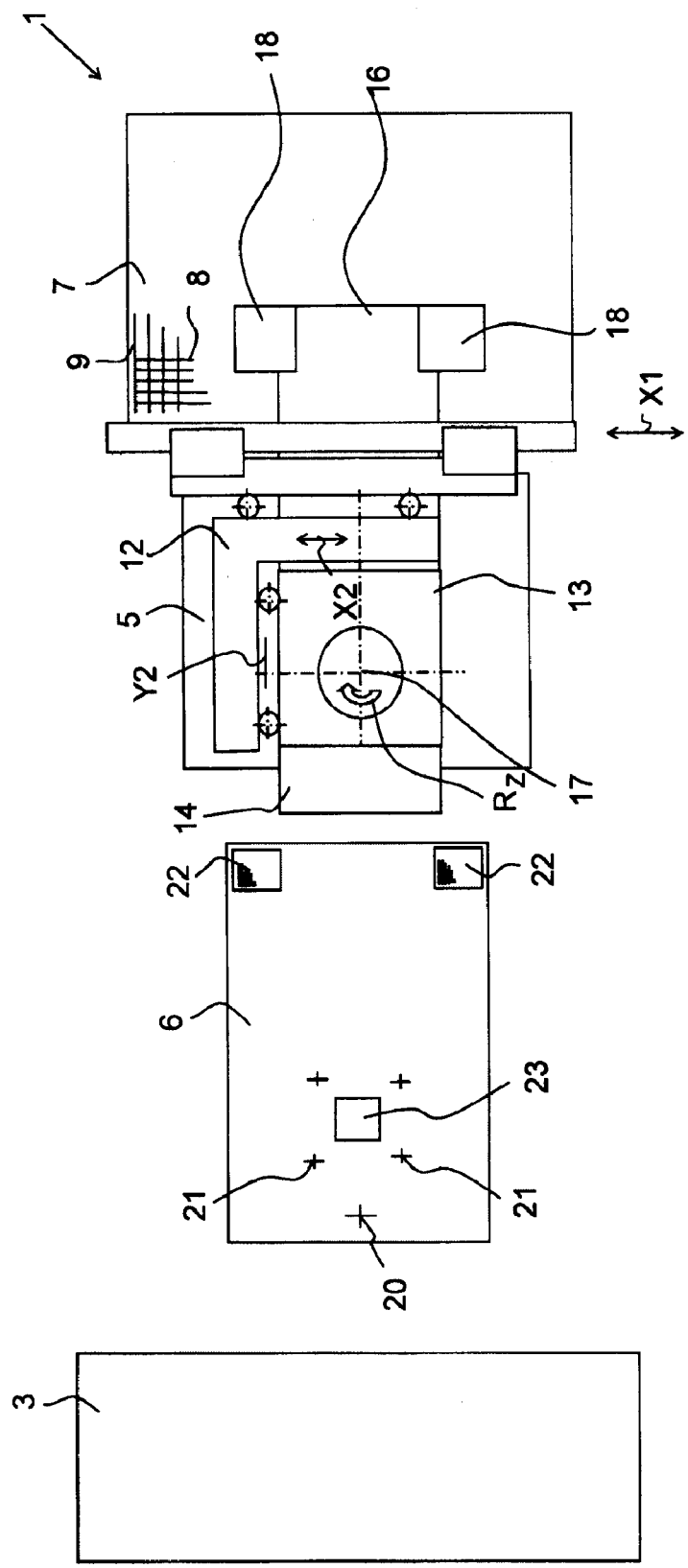

The invention relates to a device suitable for placing a component on a substrate, which device is provided with a component feeding device, a component pick-and-place device comprising a nozzle, a substrate carrier, means for moving the component pick-and-place device from the component feeding device to the substrate carrier and vice versa, as well as a global measuring system for determining the position of the component pick-and-place device during movement of the component pick-and-place device from the component feeding device to the substrate carrier and vice versa.

The invention also relates to such a method.

In such device, known from European Patent EP-B1-0.829.192, the component pick-and-place device is moved in X-direction over an X-slide, the ends of the X-slide being movable in Y-direction over two parallel extending Y-slides. The position of the component pick-and-place device in Y-direction is determined by the position of the X-slide with respect to the Y-slides. The position of the component pick-and-place device in X-direction is determined by the position of the component pick-and-place device with respect to the X-slide.

The accuracy with which a component carried by the nozzle of the component pick-and-place device can be placed on a substrate dependents on the accuracy with which the position of the component pick-and-place device with respect to the X- and Y-slides can be determined. Due to, amongst others, the relatively large number of parts between the Y-slides and the nozzle, the rigidity between the nozzle and the Y-slides is relatively low, so that the accuracy with which the nozzle can be moved with relatively high accelerations and the associated acceleration forces to a desired position is also relatively low. At the same time the known device is relatively sensitive to thermal effects, drift, creep as a function of time, for example, due to slip between the various parts etc. Moreover, due to the relatively great distance between the global measuring system and the nozzle, geometrical deviations can be transmitted enlarged, which is disadvantageous for the accuracy of positioning.

The object of the invention is to provide a device with which a component can be placed on a substrate in a relatively accurately way.

This object is achieved with the device according to the invention in that the device is further provided with a local measuring system, remote from the global measuring system, for almost continually determining, in the proximity of a desired position of the component on the substrate, the position of the component pick-and-place device with respect to the substrate, which local measuring system is located closer to the substrate carrier than the global measuring system.

As the local measuring system is located closer to the substrate carrier, the number of parts present between the local measuring system and the nozzle is substantially lower, so that a higher rigidity and stability is achieved. Moreover geometrical deviations because of the shorter distance between the local measuring system and the substrate carrier have less or no impact. Therefore the accuracy with which the component can be moved to the desired position is higher.

An embodiment of the device according to the invention is characterized in that the local measuring system includes a grid located in the proximity of the substrate carrier, as well as at least one sensor that is connected to the component pick-and-place device, by means of which sensor the position of the component pick-and-place device can be determined with respect to the grid.

A grid includes a number of parallel extending reference lines, the distance of two adjacent reference lines defining the accuracy with which by means of the sensor the position of the component pick-and-place device can be determined. Such a grid can be positioned relatively easily near the substrate carrier. As soon as the component pick-and-place device, and accordingly the connected sensor is brought into the proximity of the substrate supported by the substrate carrier, the grid can be perceived by means of the sensor. As soon as the position of the component pick-and-place device is determined with respect to the grid, the component pick-and-place device can be moved accurately with respect to the grid. The grid can also include a different X-, Y-pattern that is recognizable to the sensor, like, for example, a kind of draught board.

Another embodiment of the device according to the invention is characterized in that the nozzle is at least moveable with respect to the component pick-and-place device in a plane extending parallel to the substrate carrier, wherein the sensor is connected to the nozzle.

In this manner it is possible to no longer move the component pick-and-place device in the proximity of the desired position on the substrate, but just to move the nozzle with respect to the component pick-and-place device, so that the mass to be moved is relatively small. Such small mass can be moved easily and accurately to the desired position by means of the sensor and the grid.

Yet another embodiment of the device according to the invention is characterized in that the component pick-and-place device is provided with a first imaging device for determining the desired position of the component on the substrate with respect to the grid.

Because both the first imagining device and the sensor are connected to the component pick-and-place device, is it possible to calculate the position of the substrate with respect to the grid by determining the position of the first imaging device with respect to the substrate and the position of the sensor with respect to the grid.

Yet another embodiment of the device according to the invention is characterized in that the device is provided with a second imaging device for determining the position of the component picked up by the nozzle of the component pick-and-place device with respect to the nozzle.

By means of the second imaging device the position of the component with respect to the nozzle can easily be determined. By also determining the position of the substrate with respect to the grid, it is subsequently possible to move the component accurately to the desired position on the substrate, using the sensor and the grid.

Yet another embodiment of the device according to the invention is characterized in that the device includes a reference element provided with one of at least a first and second marker, wherein during creation of an image of the component by means of the second imaging device at the same time images of the first and second marker are created by the first and second imaging device respectively.

By means of such reference element the position of the component can easily be determined with respect to the first imaging device, and subsequently with respect to the nozzle.

Another embodiment of the device according to the invention is characterized in that the reference element includes at least a third marker that is perceptible by means of the sensor during the creation of images by means of the first and second imaging devices.

Thus each time that the position of the component with respect to the nozzle is determined, the position of the first imaging device with respect to the sensor can be verified at the same time. If for instance, because of a rise in temperature and the subsequent expansions, the distance between the first imaging device and the sensor has changed, the distance between the sensor and the nozzle will have changed as well. By measuring this change, it can be taken into account while placing the component on the substrate.

The invention further relates to a method that is characterized in that during movement of the component pick-and-place device from the component feeding device to the substrate supported by the substrate carrier, the position of the component pick-and-place device is determined by means of the global measuring system, whereas in the proximity of the desired position of the component on the substrate, the position of the component pick-and-place device is almost continually determined by means of a local measuring system that is located closer to the substrate carrier than the global measuring system.

As the local measuring system is located closer to the substrate carrier, less parts need to be present between the local measuring system and the nozzle, as a result of which the nozzle and consequently also the component carried by the nozzle can be accurately moved to the desired position on the substrate.

BRIEF SUMMARY OF THE INVENTION

Figure 2:
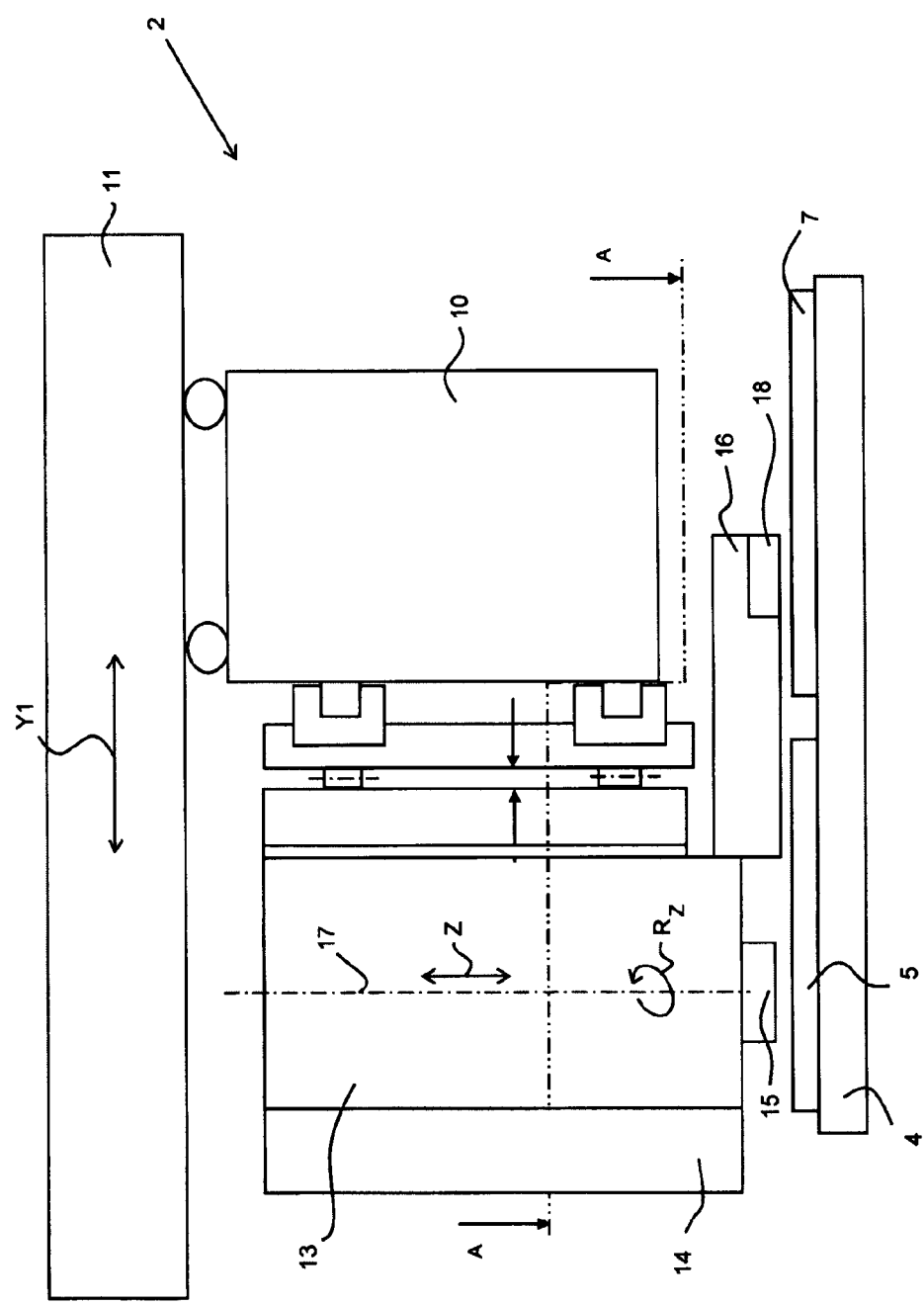
Figures 3A, 3B:
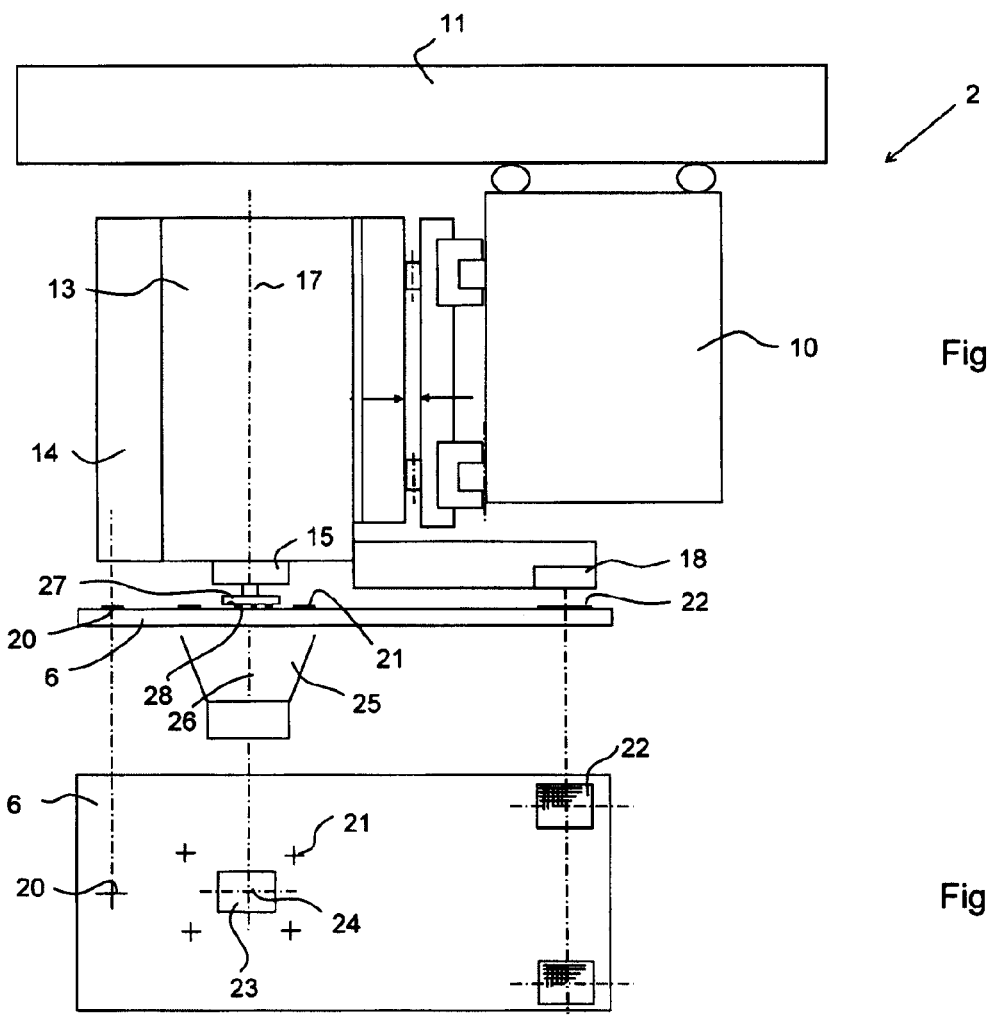

The invention will be further explained with reference to the drawings, in which:

FIG. 1 shows a schematic plan view of an embodiment of a device according to the invention, FIG. 2 shows a side view of the right section of the device shown in FIG. 1, FIGS. 3a and 3b respectively show a side view and a plan view of the device shown in FIG. 1, where the component pick-and-place device is located above the reference element.

BRIEF SUMMARY OF THE INVENTION

In the figures like reference numerals refer to like parts.

FIGS. 1 and 2 show a device 1 according to the invention, which is provide with a component pick-and-place device 2 that is moveable from a component feeding device 3 to a substrate 5 supported by a substrate carrier 4 and vice versa. The right section of FIG. 1 shows a plan view in the direction indicated by arrows A-A in FIG. 2. Between the component feeding device 3 and the substrate carrier 5 a plate-shaped reference element 6 is located. The substrate carrier is provided with a grid 7 on a side avert from the component feeding device 3. The grid 7 includes a first series of parallel extending reference lines 8. The grid 7 further includes a second series parallel extending reference lines 9, which extend perpendicular to the first series of reference lines. The reference lines 8, 9 are located at a distance of, for example, 20 microns from each other. In the figures only some of these reference lines are denoted.

The component pick-and-place device 2 includes a slide 10 that is moveable with respect to a frame 11 in the directions indicated by the double arrows X1 and Y1 over, for example, 400 mm and 1000 mm respectively. The position of the component pick-and-place device 2 with respect to the frame 11 is determined by means of a generally known global measuring system, which, for example, is combined with the drive of the component pick-and-place device 2. By slide 10 an L-shaped frame 12 is supported, which is moveable with respect to the slide 10 by means of a Lorentz-actuator in the directions indicated by the double arrow X2. By the L-shaped frame 12 a holding device 13 is supported, which is moveable by means of a Lorentz-actuator in the directions that are indicated by the double arrow Y2. By means of the Lorentz-actuators movements of, for example, 1 mm are possible. The holding device 13 comprises a first imaging device 14, a nozzle 15 and a sensor unit 16. The nozzle 15 is moveable with respect to the holding device 13 in the directions indicated by the double arrow Z. The nozzle 15 is further rotatable about the axis 17 in the directions indicated by the double arrow R.

The sensor unit 16 comprises two encoders 18, spaced apart from each other in X-direction, by means of which the reference lines of the grid 7 can be perceived. The encoders 18 are located relatively close to the nozzle 15. The sensor unit 16 is rigidly connected to the holding device 13. The encoders 16 and the grid 7 together form a local measuring system. The 20-micron spacing between the reference lines provides a sine-shaped signal in the encoders 18 with a period of 20 micron. By interpolation of the sine-shaped signal a measuring resolution of 5 nanometres can be realized.

The device 1 is provided with the plate-shaped reference element 6 that is located in Z-direction at about the same level as the top of the substrate 5 and the grid 7. The plate-shaped reference element 6 is preferably transparent and provided with a first marker 20, a second set of markers 21 and a third set of markers 22. The second set of markers 21 is located about an opening 23 in the plate-shaped reference element 6. The third markers 22 are provided with reference lines in the same way as the grid 7. The distances between the first marker 20, the centre 24 of the opening 23 and the third markers 22 are almost equal to the distances between the first imaging device 14, the axis 17 and the encoders 18 (see FIGS. 3A and 3B).

On a side of the plate-shaped reference element 6 that is averted from the component pick-and-place device 2, the device 1 is provided with a second imaging device 25, the axis 26 of which coincides with the centre 24 of the opening 23. In the image field of the second imaging device 25, two markers 21 are located next to the opening 23 as well. The relative positions of the markings 20, 21 and 22 are measured accurately, and are consequently known.

Device 1 is operated as follows.

The component pick-and-place device 2 is moved in the directions indicated by the double arrows X1, Y1 to a position denoted above the component feeding device 3. Then the nozzle 15 is moved in a downward direction, so that by means of the underpressure applied in the nozzle 15a component 27 can be picked up. The component pick-and-place device 2 is then moved to a position located above the plate-shaped reference element 6. Such a position is denoted in FIGS. 3A and 3B. By means of the first imaging device 14 an image of the first marker 20 is created. At the same time, by means of the second imaging device 25, an image is created of the second markers 21, the component 27 and the connection points 28 that are mounted on the bottom side of the component 27. By means of the encoders 18 the third markers 22 can be perceived as well. Because the relative positions of the markers 20, 21 and 22 are known, the orientation of the component 27 in X-, Y- and Rz-direction with respect to the encoders 18 can be determined from the images created by the first and second imaging devices 14, 25 and from the grid lines perceived by the encoders 18.

Next the component pick-and-place device 2 is moved to a position denoted above the substrate 5. The substrate 5 is provided with markers, also known as fiducials, in respect of which the desired position of the component to be placed is known. The fiducials are perceived by means of the first imaging device 14. At the same time the position of the first imaging device 14 with respect to the grid 7 is determined by means of the encoders 18. From the obtained information the position of the fiducials is known and consequently of the desired position of the component 27 to be placed with respect to the grid 7. The component pick-and-place device 2 is moved to the desired position, while the movement is accurately measured by means of the encoders 18 and the grid 7. In the proximity of the desired position the component pick-and-place device 2 is put to a halt. Now the Lorentz actuators of the holding device 13 are controlled by the encoders 18, as a result of which the holding device 13, the nozzle 15 and the component 27, supported by the nozzle 15 are moved with respect to the component pick-and-place device 2 in X2- and Y2-direction to the desired position above the substrate 5.

If preferred, the component 27 may be rotated in Rz-direction into the desired orientation as well. As soon as the component 27 is located above the desired position, the nozzle 15 is moved downward in Z-direction and the component 27 is placed on the substrate.

Without the use of the encoders 18 and the grid 5, a placement accuracy of about 10 micron can be realized. By means of the encoders 18 and the grid 7, as well as by means of movement of the holding device 13 with respect to the component pick-and-place device 2, a placement accuracy of 0.1 micron can be realized.

As soon as the encoders 18 are moved to an area outside the grid 7, the position of the holding device 13 with respect to the component pick-and-place device 2 is measured by means of, for example, the sensors (not indicated) that are located between the component pick-and-place device 2 and the holding device 13. Such sensors can be more inaccurate than the encoders 18 and the grid 7.

It is also possible to provide in a grid in the proximity of the component feeding device 3 as well, which grid is comparable to grid 7, so that also the picking up of the component 27 can take place accurately.

It is also possible to rigidly connect the holding device 13 to the component pick-and-place device 2, while close to the desired position on the substrate 5 the movement of the component pick-and-place device 2 is guided and controlled by means of the encoders 18 and the grid 7.

The grid can also have a reference marker that is used as a point of departure for the encoders.

The grid may have a different spacing between the reference lines. Instead of reference lines, the grid may also include a different regular X, Y-pattern of planes, for example.

Instead of encoders and a grid, also interferometers, induction measuring systems etc. can be used as local measuring system.

Instead of Lorentz actuators, use can also be made of other actuators with which relatively accurately a relatively small movement may be carried out.

It is also possible to perceive, instead of fiducials, trace patterns (artwork) present on the substrate by means of the first imaging device.

It is also possible to determine the position of the component with respect to the nozzle by means of the first imaging device, for example, according to a method described in WO2004/064472.

The invention claimed is:

1. A component mounting device suitable for placing a component on a substrate comprising
a component feeding device,
a component pick-and-place device comprising a nozzle,
a substrate carrier,
means for moving the component pick-and-place device from the component feeding device to said substrate carrier to pick up a component with said nozzle of said component pick-and-place device from said component feeding device and to place said picked-up component at a desired position on said substrate being located on said substrate carrier,
a global measuring system for determining the position of said component pick-and-place device during movement of said component pick-and-place device from said component feeding device to said substrate carrier and for determining the position of said component pick-and-place device during movement of said component pick-and-place device from said substrate carrier to said component feeding device
whereby said component mounting device further comprises a local measuring system, remote from said global measuring system, for substantially continually determining, in the proximity of said desired position of said component on the substrate, the position of said component pick-and-place device with respect to said substrate, during said movement of said component pick-and-place device and which local measuring system is located closer to said substrate carrier than said global measuring system.

2. A component mounting device suitable for placing a component on a substrate comprising
a component feeding device,
a component pick-and-place device comprising a nozzle,
a substrate carrier,
means for moving the component pick-and-place device from the component feeding device to said substrate carrier to pick up a component with said nozzle of said component pick-and-place device from said component feeding device and to place said picked-up component at a desired position on said substrate being located on said substrate carrier,
a global measuring system for determining the position of said component ick-and-p:placein movement of said component pick-and-place device from said component feeding device to said substrate carrier and for determining the position of said component pick-and-place device during movement of said component pick-and-place device from said substrate carrier to said component feeding device
whereby said component mounting device further comprises a local measuring system, remote from said global measuring system, for substantially continually determining, in the proximity of said desired position of said component on the substrate, the position of said component pick-and-place device with respect to said substrate, which local measuring system is located closer to said substrate carrier than said global measuring system,
wherein said local measuring system includes a grid located in the proximity of said substrate carrier, as well as at least one sensor that is connected to said component pick-and-place device, said sensor is being used to determine the position of said component pick-and-place device with respect to said grid.

3. Device according to claim 2, wherein the nozzle is moveable with respect to the component pick-and-place device in a plane extending parallel to the substrate carrier, wherein the sensor is connected to the nozzle.

4. Device according to claim 2, wherein the component pick-and-place device is provided with a first imaging device for determining the desired position of the component on the substrate with respect to the grid.

5. Device according to claim 4, wherein the device is provided with a second imaging device for determining the position of the component picked up by the nozzle of the component pick-and-place device with respect to the nozzle.

6. Device according to claim 5, wherein the device includes a reference element provided with one of at least a first and second marker, wherein during creation of an image of the component by means of the second imaging device at the same time images of the first and second marker are created by the first and second imaging device respectively.

7. Device according to claim 6, wherein the reference element includes at least a third marker that is perceptible by means of the sensor during the creation of images by means of the first and second imaging devices.

* * * * *